United States Patent
Gong et al.

(10) Patent No.: US 11,431,336 B2
(45) Date of Patent: Aug. 30, 2022

(54) SWITCHING CIRCUIT

(71) Applicant: VALEO VISION, Bobigny (FR)

(72) Inventors: Tianxun Gong, Foshan (CN); Jintao Liang, Foshan (CN); Sylvain Yvon, Bobigny (FR); Peiliang Yuan, Foshan (CN); Shangye Fang, Foshan (CN); Zhenyu Zhang, Foshan (CN)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 17/293,227

(22) PCT Filed: Nov. 12, 2019

(86) PCT No.: PCT/CN2019/117276
§ 371 (c)(1),
(2) Date: May 12, 2021

(87) PCT Pub. No.: WO2020/098615
PCT Pub. Date: May 22, 2020

(65) Prior Publication Data
US 2022/0006452 A1    Jan. 6, 2022

(30) Foreign Application Priority Data
Nov. 13, 2018  (CN) .......................... 201811349612.6

(51) Int. Cl.
*H03K 3/00*  (2006.01)
*H03K 5/08*  (2006.01)
(Continued)

(52) U.S. Cl.
CPC ......... *H03K 17/567* (2013.01); *H03K 17/063* (2013.01)

(58) Field of Classification Search
None
See application file for complete search history.

(56) References Cited

U.S. PATENT DOCUMENTS 5,283,707 A * 2/1994 Conners ................. H02H 9/001
                                                    323/908
5,939,867 A * 8/1999 Capici ..................... G05F 1/565
                                                    323/277
(Continued)

FOREIGN PATENT DOCUMENTS

CN       103633826 A       3/2014
CN       104079276 A      10/2014
(Continued)

OTHER PUBLICATIONS

International Search Report dated Feb. 14, 2020 in PCT/CN2019/117276 filed on Nov. 12, 2019, 2 pages.
(Continued)

*Primary Examiner* — Kenneth B Wells
(74) *Attorney, Agent, or Firm* — Oblon, McClelland, Maier & Neustadt, L.L.P.

(57) ABSTRACT

Embodiments of the present invention provide a switching circuit. The circuit comprises: a charging sub-circuit, which has a first input end and an output end; a switching sub-circuit, which has a first end, a second end, and a control end, wherein the control end of the switching sub-circuit is connected to the output end of the charging sub-circuit; and a function sub-circuit, which is connected to the first end or the second end of the switching sub-circuit, and has a first node, wherein an operating voltage of the first node is higher than an input voltage of an input power supply, the switching sub-circuit comprises one or more NMOS switches, and the first input end of the charging sub-circuit is connected to the first node.

9 Claims, 7 Drawing Sheets

(51) Int. Cl.
H03K 17/687 (2006.01)
H02M 3/07 (2006.01)
H03K 17/567 (2006.01)
H03K 17/06 (2006.01)

(56) References Cited

U.S. PATENT DOCUMENTS

| | | | | |
|---|---|---|---|---|
| 6,204,700 | B1 * | 3/2001 | Seyed | H03K 17/063 |
| | | | | 327/108 |
| 6,225,797 | B1 * | 5/2001 | Willis | G05F 1/573 |
| | | | | 323/351 |
| 6,947,272 | B2 * | 9/2005 | Daniels | H03K 17/0822 |
| | | | | 361/93.7 |
| 8,232,830 | B2 * | 7/2012 | Takeshita | H03K 17/063 |
| | | | | 327/330 |
| 9,520,879 | B2 | 12/2016 | Zhang et al. | |
| 9,755,634 | B2 | 9/2017 | Knoedgen | |
| 10,128,833 | B2 * | 11/2018 | Nilles | H02M 3/07 |
| 10,425,074 | B2 | 9/2019 | Nakajima | |
| 2003/0184934 | A1 | 10/2003 | Bushue et al. | |
| 2009/0102427 | A1 | 4/2009 | Tamegai et al. | |

FOREIGN PATENT DOCUMENTS

| | | |
|---|---|---|
| CN | 107612531 A | 1/2018 |
| EP | 0 626 745 A2 | 5/1994 |

OTHER PUBLICATIONS

Extended European Search Report dated Jul. 11, 2022 in European Application No. 19884018.3, 7 pages.

* cited by examiner

SWITCHING CIRCUIT

TECHNICAL FIELD

The present disclosure relates to the field of electronic devices, in particular to a switching circuit.

BACKGROUND ART

P-channel MOSFETs are often used in electronic circuits as reverse protection switches for large-current applications, e.g. input protection switches and output switches, due to the fact that P-channel MOSFETs are easy to drive. However, P-channel MOSFETs are relatively expensive and have poor performance, and there are not many types to choose from, so the development of PMOS input protection switches and output switches has been limited.

SUMMARY OF THE INVENTION

The present disclosure provides a switching circuit, and is capable of driving the switching circuit in a simple configuration.

According to one aspect of exemplary embodiments of the present disclosure, a switching circuit is provided, comprising:

a charging sub-circuit, having a first input end and an output end;

a switching sub-circuit, having a first end, a second end and a control end, wherein the control end of the switching sub-circuit is connected to the output end of the charging sub-circuit;

a functional sub-circuit, connected to one of the first end and second end of the switching sub-circuit, and the functional sub-circuit having a first node, wherein an operating voltage of the first node is higher than an input voltage of an input power supply, wherein the switching sub-circuit comprises one or more NMOS switches, and the first input end of the charging sub-circuit is connected to the first node.

As an example, the other of the first end and second end of the switching sub-circuit is connected to the input power supply, and the charging sub-circuit further comprises a second input end connected to the input power supply.

As another example, the switching circuit further comprises a first capacitor, one end of the first capacitor being connected to that one of the first end and second end of the switching sub-circuit which is connected to the functional sub-circuit, and another end of the first capacitor being grounded.

As another example, the charging sub-circuit comprises a first diode, a second diode and a second capacitor, wherein the anode of the first diode is connected, as the second input end of the charging sub-circuit, to the input power supply, and the cathode is connected to the control end of the switching sub-circuit; one end of the second capacitor is connected to the control end of the switching sub-circuit, and the other end is grounded; and the second diode, wherein the anode of the second diode is connected, as the first input end of the charging sub-circuit, to the first node, and the cathode thereof is connected to the control end of the switching sub-circuit.

As another example, when an output end of the functional sub-circuit is connected to one of the first end and second end of the switching sub-circuit, the other of the first end and second end of the switching sub-circuit is used as an output end, so as to output an output signal of the functional sub-circuit.

As another example, when multiple input power supplies are present, the switching circuit comprises multiple switching sub-circuits corresponding to the multiple input power supplies respectively, wherein for each of the multiple switching sub-circuits, one of the first end and second end of the switching sub-circuit is connected to the functional sub-circuit, the other of the first end and second end is connected to the corresponding input power supply, and the control end is connected to the output end of the charging sub-circuit; and the charging sub-circuit further comprises multiple second input ends connected to the multiple input power supplies.

As another example, each of the multiple switching sub-circuits comprises a pair of N-channel MOSFETs connected in a mirror-image fashion, and the control end thereof is connected to the output end of the charging sub-circuit.

As another example, the charging sub-circuit comprises a first set of diodes, a second diode and a second capacitor, wherein: the anode of each of the first set of diodes acts as one of the multiple second input ends connected to the multiple input power supplies, and the cathode is connected to the control ends of the switching sub-circuits; one end of the second capacitor is connected to the control ends of the switching sub-circuits, and the other end is grounded; and the second diode, wherein the anode of the second diode is connected, as the first input end of the charging sub-circuit, to the first node, and the cathode thereof is connected to the control ends of the switching sub-circuits.

BRIEF DESCRIPTION OF THE DRAWINGS

In order to gain a more complete understanding of the present disclosure and the advantages thereof, the following description in conjunction with the drawings will now be referred to, wherein.

DETAILED DESCRIPTION OF THE INVENTION

Figure 1:
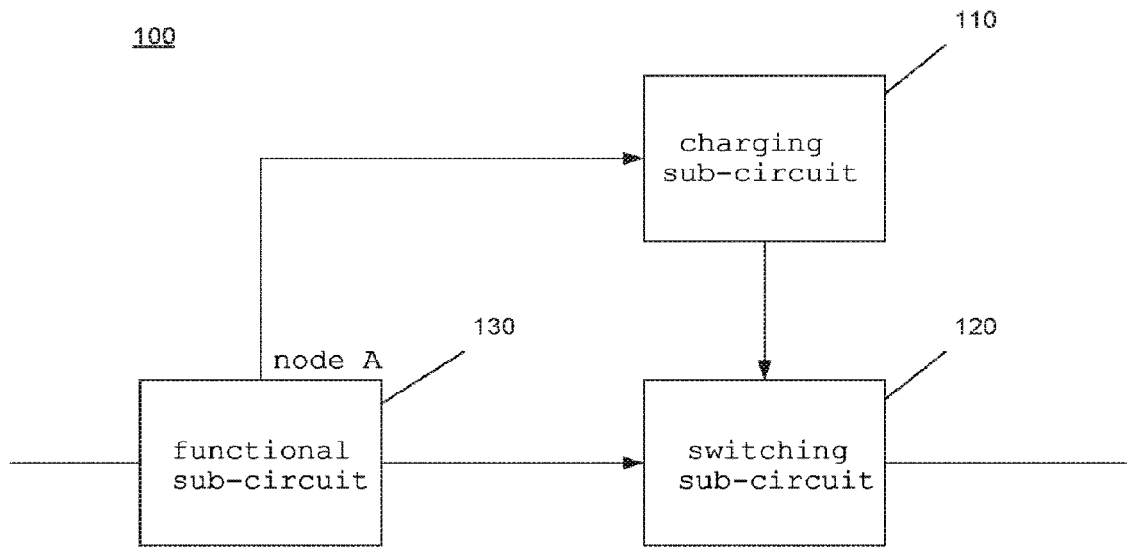
FIG. 1 shows a block diagram of a switching circuit according to an exemplary embodiment of the present disclosure.

Embodiments of the present disclosure are described below with reference to the drawings. However, it should be understood that these descriptions are merely exemplary, and need not limit the scope of the present disclosure. Furthermore, in the explanation below, descriptions of well known structures and technologies are omitted, to avoid needlessly confusing the concept of the present disclosure.

The terms used here are merely intended to describe particular embodiments, not to limit the present disclosure. Words such as "a" and "the" used herein should also include the meaning of "multiple", unless clearly indicated otherwise in the context. Furthermore, terms such as "comprise" and "include" used herein indicate the existence of the feature, step, operation and/or component mentioned, but do not rule out the existence or addition of one or more other features, steps, operations or components. In addition, in this specification, unless clearly indicated, the terms "bipolar junction transistor" and "transistor" can be used interchangeably.

All of the terms used herein (including technical and scientific terms) have the meanings commonly understood by those skilled in the art, unless otherwise defined. It should be noted that the terms used herein should be interpreted as having meanings in conformity with the context of this specification, and should not be interpreted in an idealized or overly stiff way.

Some block diagrams and/or flow charts are shown in the drawings. It should be understood that some blocks or combinations thereof in the block diagrams and/or flow charts can be implemented by computer program instructions. These computer program instructions can be provided to a processor of a general-purpose computer, a dedicated computer or another programmable data processing means, such that these instructions, when executed by the processor, can create means for realizing the functions/operations illustrated in these block diagrams and/or flow charts.

Thus, the technology of the present disclosure can be realized in the form of hardware and/or software (including firmware, microcode, etc.). Furthermore, the technology of the present disclosure can take the form of a computer program product on a computer-readable medium with instructions stored thereon, and this computer program product can be used by an instruction execution system or used in conjunction with an instruction execution system. In the context of the present disclosure, the computer-readable medium can be any medium capable of containing, storing, transferring, propagating or transmitting instructions. For example, computer-readable media may include but are not limited to electrical, magnetic, optical, electromagnetic, infrared or semiconductor systems, apparatuses, devices or propagating media. Specific examples of computer-readable media include: magnetic storage means, such as magnetic tapes or hard disks (HDD); optical storage means, such as optical disks (CD-ROM); memories, such as random-access memory (RAM) or flash memory; and/or wired/wireless communication links.

An embodiment of the present disclosure provides a switching circuit, which is capable of driving an NMOS switch in a simple configuration.

FIG. 1 shows a block diagram of a switching circuit 100 according to an exemplary embodiment of the present disclosure. As shown in FIG. 1, the switching circuit 100 may comprise a charging sub-circuit 110, a switching sub-circuit 120 and a functional sub-circuit 130. Specifically, the switching sub-circuit 120 may comprise one or more NMOS switches. The functional sub-circuit 130 may be a circuit configured to execute a particular function, and a feature of this circuit is the existence of a first node, i.e. a node A, with a voltage higher than an input power supply voltage. A first input end of the charging sub-circuit 110 is connected to node A in the functional sub-circuit 130, and an output end of the charging sub-circuit 110 is connected to a control end of the switching sub-circuit 120, for the purpose of controlling the on/off switching of the switch. That is to say, the charging sub-circuit is charged by means of the voltage of node A, and the on/off switching of the switch connected to the functional sub-circuit is thereby controlled.

It should be noted that FIG. 1 only shows schematically a structural block diagram of the switching circuit according to an exemplary embodiment of the present disclosure; the switching circuit according to an exemplary embodiment of the present disclosure may comprise a greater or smaller number of devices, depending on the situation in which it is being used. Specific descriptions are given below of specific configurations of the switching circuit when the switching circuit according to an exemplary embodiment of the present disclosure is used as an input switching circuit, an output switching circuit and a multi-input switching circuit.

Figure 2A:
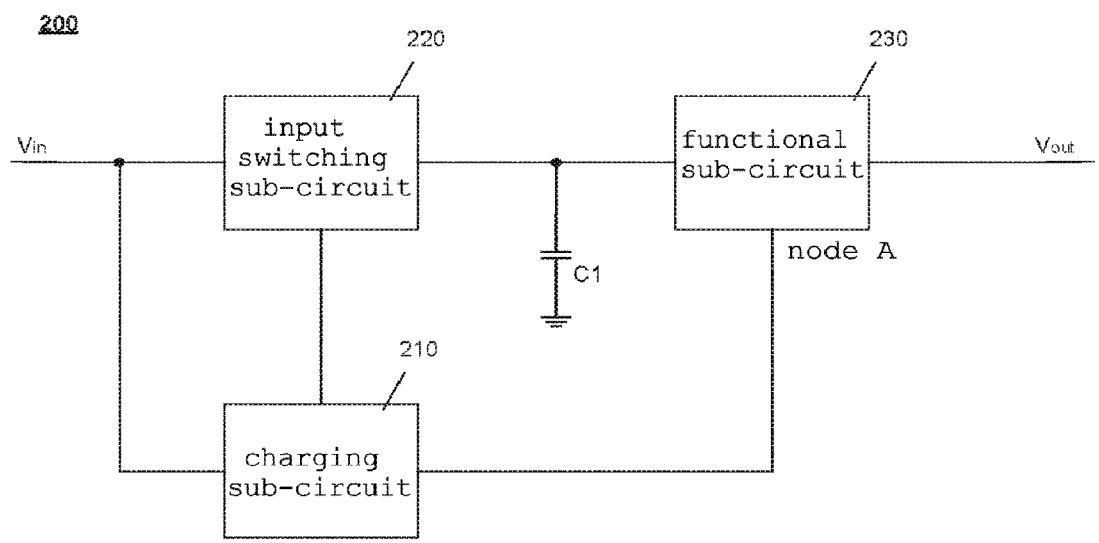
FIGS. 2a) and 2b) show a block diagram and a basic circuit diagram of a circuit when the switching circuit according to an exemplary embodiment of the present disclosure is used as an input switching circuit.

FIGS. 2a) and 2b) show a block diagram and a basic circuit diagram of the circuit when the switching circuit according to an exemplary embodiment of the present disclosure is used as an input switching circuit.

As shown in FIG. 2a), when the switching circuit according to an exemplary embodiment of the present disclosure is used as an input switching circuit, the circuit 200 may comprise a charging sub-circuit 210, an input switching sub-circuit 220 and a functional sub-circuit 230. The input switching sub-circuit 220 has an input end connected to an input power supply $V_{in}$ and an output end connected to the functional sub-circuit 230, and the input switching sub-circuit 220 may comprise one or more NMOS transistors. Furthermore, the charging sub-circuit 210 has a first input end connected to a node A in the functional sub-circuit, a second input end connected to the input power supply, and an output end connected to a control end of the input switching sub-circuit 220, wherein an operating voltage of node A is higher than the input power supply voltage. The charging sub-circuit 210 may be configured to perform pre-charging before the input switching sub-circuit 220 is turned on, so as to serve as an auxiliary power supply to drive the input switching sub-circuit 220 when the input switching sub-circuit 220 is to be turned on. The input end of the input switching sub-circuit 220 is connected to the input power supply $V_{in}$ and the output end thereof is connected to the functional sub-circuit 230, so as to subject the functional sub-circuit 230 to input reverse protection. The input switching sub-circuit 220 may be configured to be turned on or off according to the control of an output from the charging sub-circuit 210. In addition, the switching circuit 200 may also alternatively comprise a first capacitor C1. One end of the first capacitor C1 is connected to the output end of the input switching sub-circuit 220, and the other end is grounded. The functional sub-circuit 230 has a first node denoted node A, wherein the operating voltage of the first node is higher than the input voltage $V_{in}$ of the input power supply. Nodes having the abovementioned operating voltage are easily found in switch-mode power supplies. For instance, taking a SEPIC circuit as an example, the voltage on the MOSFET drain (SEPIC_MOS_Drain) has such a characteristic. Specifically, the voltage on the MOSFET drain is equal to the sum of the input voltage and output voltage. Thus, in a SEPIC circuit, the drain of the MOSFET can be chosen to be the first node.

Figure 2B:
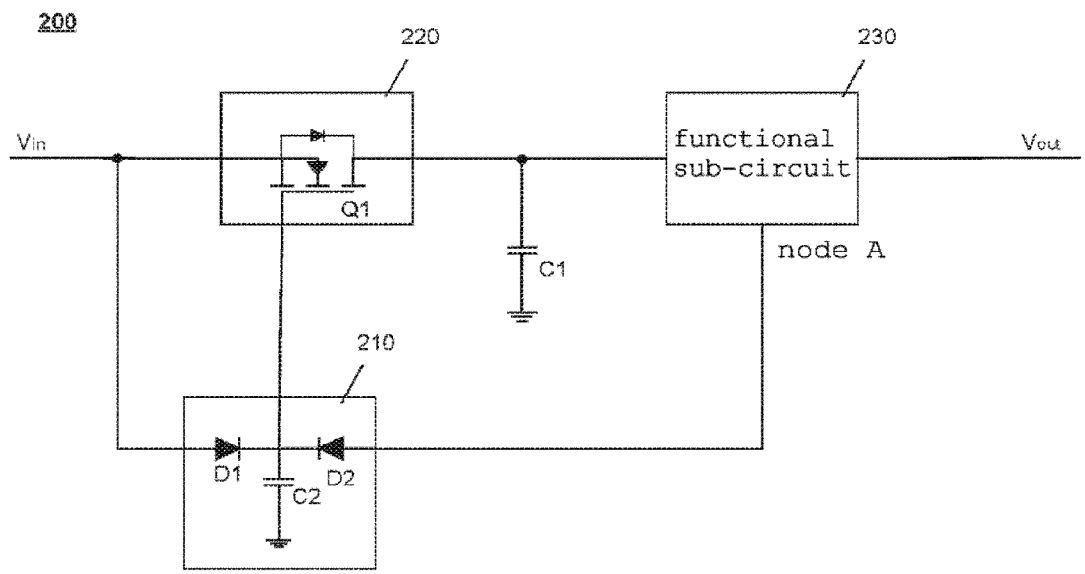

The specific structure of the input switching circuit 200 according to an exemplary embodiment of the present disclosure is now described in detail with reference to FIG. 2b). As shown in FIG. 2b), the charging sub-circuit 210 may comprise a first diode D1, a second diode D2 and a second capacitor C2. The anode of the first diode D1 can be connected, as the second input end, to the input power supply $V_{in}$, with the cathode being connected to the control end of the input switching sub-circuit 220. One end of the second capacitor C2 may be connected to the control end of the input switching sub-circuit 220, with the other end being grounded. Furthermore, the anode of the second diode D2 is connected, as the first input end of the charging sub-circuit, to the first node in the functional sub-circuit 230, and the cathode thereof is connected to the control end of the input switching sub-circuit 220.

The input switching sub-circuit 220 can be realized as an N-channel metal-oxide-semiconductor field-effect transistor (MOSFET) Q1. It should be noted that the transistor Q1 in the figure also has an intrinsic body diode, such that a forward current path is provided before Q1 turns on.

Furthermore, as an input capacitor, the first capacitor C1 may be a capacitor with a large capacitance.

Figure 3A:
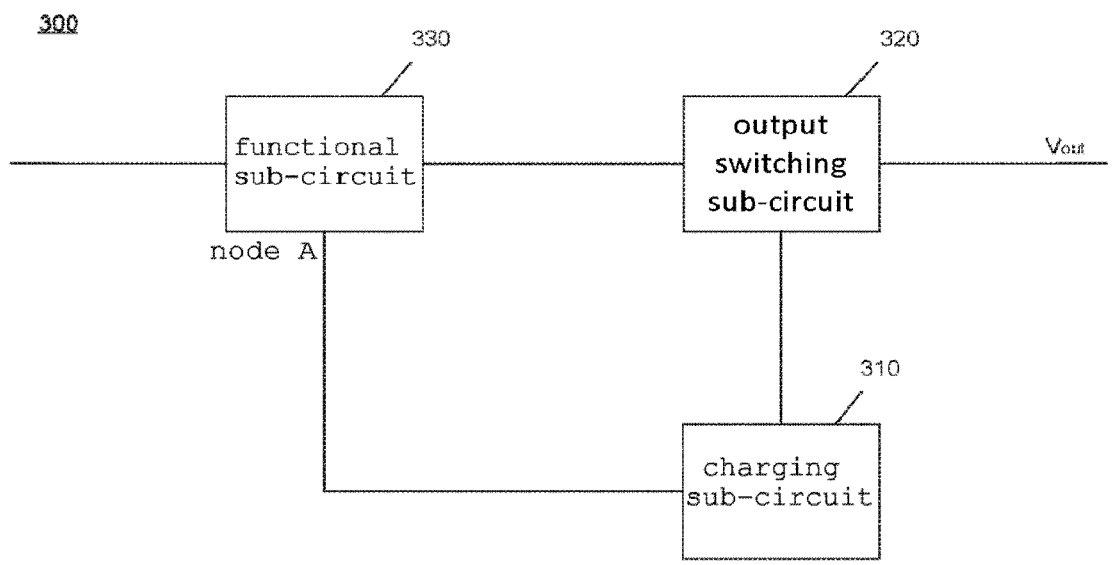
FIGS. 3a) and 3b) show a block diagram and a basic circuit diagram of a circuit when the switching circuit according to an exemplary embodiment of the present disclosure is used as an output switching circuit.

FIGS. 3a) and 3b) show a block diagram and a basic circuit diagram of the circuit when the switching circuit according to an exemplary embodiment of the present disclosure is used as an output switching circuit 300.

Figure 3B:
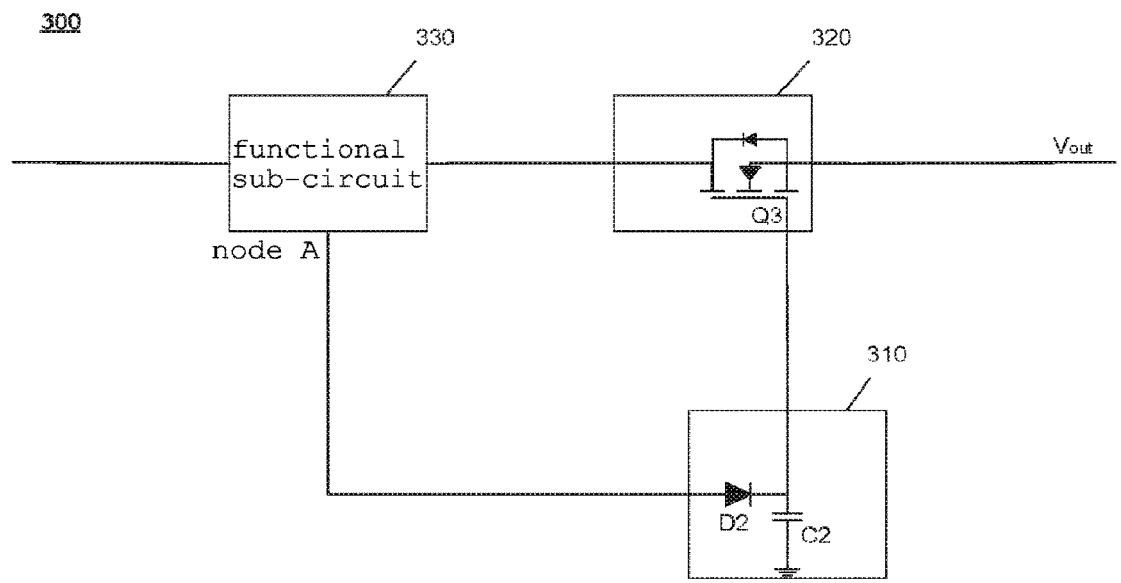

As shown in FIG. 3a), when the switching circuit according to an exemplary embodiment of the present disclosure is used as an output switching circuit, the output switching circuit 300 may comprise a charging sub-circuit 310, an output switching sub-circuit 320 and a functional sub-circuit 330. An input end of the output switching sub-circuit 320 is connected to an output end of the functional sub-circuit 330, and another end is used as an output of the output switching circuit 300. The output switching sub-circuit 320 may comprise one or more NMOS transistors. As stated above, the charging sub-circuit 310 may have a first input end connected to a node A in the functional sub-circuit, and an output end connected to a control end of the output switching sub-circuit 320, wherein an operating voltage of node A is higher than an input power supply voltage. The charging sub-circuit 310 may be configured to perform pre-charging before the output switching sub-circuit 320 is turned on, so as to serve as an auxiliary power supply to drive the output switching sub-circuit 320 when the output switching sub-circuit 320 is to be turned on. The output switching sub-circuit 320 subjects the functional sub-circuit 330 to output reverse protection. The output switching sub-circuit 320 may be configured to be turned on or off according to the control of an output from the charging sub-circuit 310, so as to output or not output an output result of the functional sub-circuit 330. The specific structure of the input switching circuit 200 according to an exemplary embodiment of the present disclosure is now described in detail with reference to FIG. 3b). As shown in FIG. 3b), the output switching sub-circuit 320 may be realized as an NMOS transistor Q3. The charging sub-circuit 310 may comprise a diode D2 and a capacitor C2. The anode of the diode D2 is connected, as the first input end of the charging sub-circuit, to the first node in the functional sub-circuit 330, and the cathode thereof is connected to the control end of the output switching sub-circuit 320. One end of the capacitor C2 may be connected to the control end of the output switching sub-circuit 320, with the other end being grounded.

Figure 4:
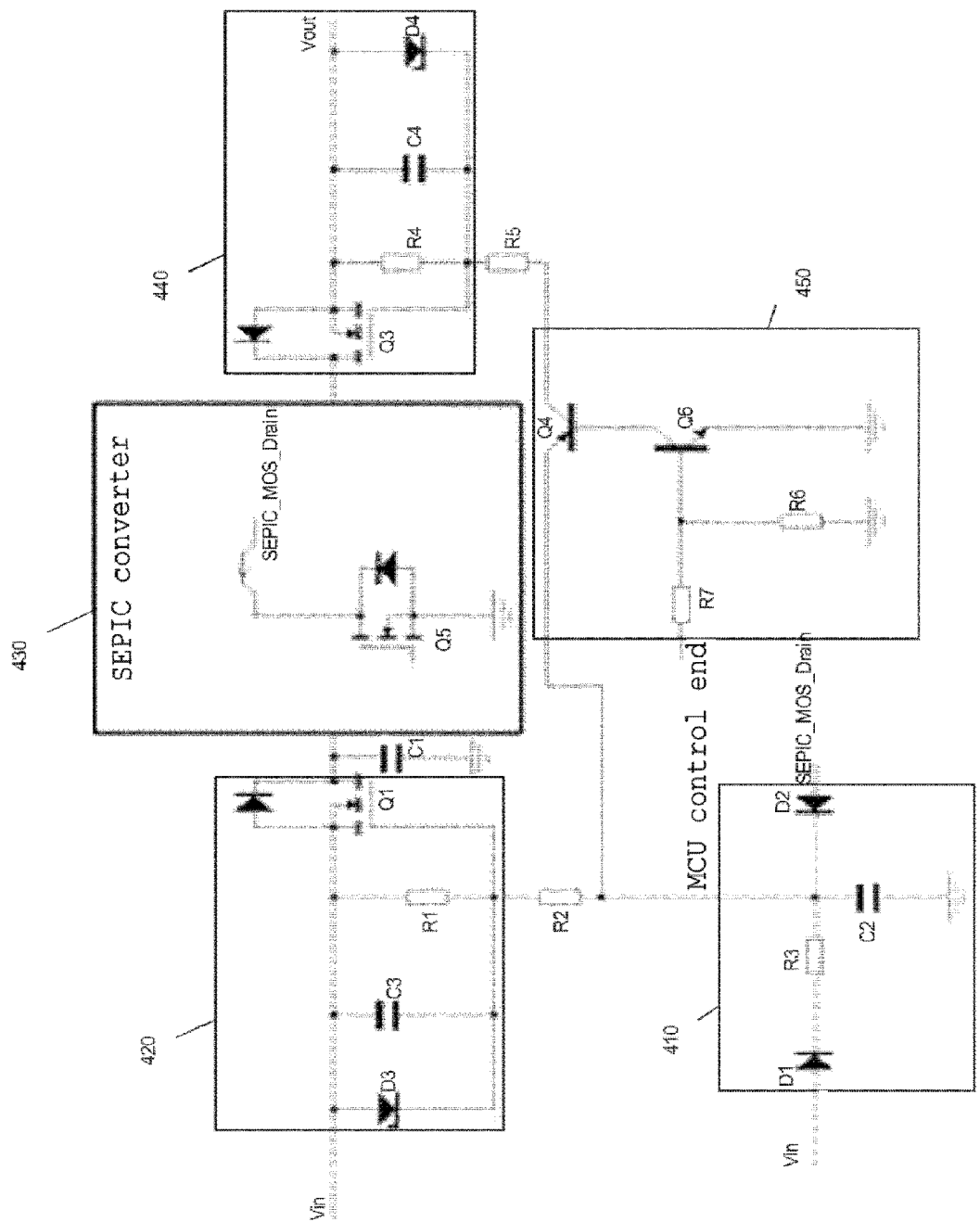
FIG. 4 shows a particular manner of implementation of the switching circuit according to an exemplary embodiment of the present disclosure.

FIG. 4 shows a particular manner of implementation of the switching circuit according to an exemplary embodiment of the present disclosure. As shown in FIG. 4, taking a SEPIC circuit 430 as an example of the functional sub-circuit, a manner of implementation of the switching circuit according to an exemplary embodiment of the present disclosure is shown. As shown in the figure, the switching circuit comprises a charging sub-circuit 410, an input switching sub-circuit 420, a functional sub-circuit 430 and an output switching sub-circuit 440. Furthermore, the switching circuit may additionally comprise an MCU control sub-circuit 250. It should be noted that although the switching circuit is shown as comprising both the input switching sub-circuit 420 and the output switching sub-circuit 430 in this example, the present disclosure is not limited to this, and may alternatively comprise one of the input switching sub-circuit 420 and the output switching sub-circuit 430. That is to say, in addition to the charging sub-circuit 410 and the functional sub-circuit 430, the switching circuit may comprise only one switching sub-circuit of the input switching sub-circuit 420 and the output switching sub-circuit 430.

As shown in FIG. 4, the charging sub-circuit 410 may comprise a first diode D1, a second diode D2 and a second capacitor C2, wherein the anode of the first diode D1 is connected to an input power supply, and the anode of the second diode D2 is connected to the drain SEPIC_MOS_Drain of a MOSFET in the SEPIC circuit (i.e. acting as a first node of the functional sub-circuit). Furthermore, the charging sub-circuit 410 may additionally comprise a resistor R3 connected in series with the first diode D1, such that there is a possibility of controlling an inrush current to the second capacitor C2. Besides comprising an N-type MOSFET Q1 for executing a switching function, the input switching sub-circuit 420 may also comprise a device for preventing too large a voltage at the base of the transistor Q1 and devices for resistance matching and current protection (e.g. a diode D3, a capacitor C3 and a resistor R1).

When the N-type MOSFET Q1 is not turned on (i.e. the input power supply $V_{in}$ has just been applied across the diode D1, the capacitor R3 and the capacitor C2), and the voltage built up on C2 has not yet caused Q1 to turn on), the input power supply $V_{in}$ charges the second capacitor C2 via the first diode D1, such that the N-type MOSFET Q1 is partially turned on under the action of the voltage of the second capacitor C2. Furthermore, the input power supply charges a first capacitor C1 via the intrinsic body diode of the N-type MOSFET Q1. When the voltage of the first capacitor C1 is sufficient to turn on a SEPIC converter 230, the first capacitor C1 supplies power to the SEPIC rapidly, such that the voltage of a first node in the SEPIC converter 230, i.e. the drain voltage of the SEPIC converter (SEPIC_MOS_Drain) is higher than the input voltage $V_{in}$, so that the first node charges the second capacitor C2 via the second diode D2. Subsequently, when the electric potential of the second capacitor C2 is sufficient to turn on the N-type MOSFET Q1 completely, the charging sub-module, as an auxiliary power supply, causes the N-type MOSFET Q1 to turn on completely.

Thus, an input switching circuit is realized, in which circuit control of the NMOS switch is achieved by adding the charging sub-circuit and leading out a node having a high electric potential (higher than the input voltage) in the functional sub-circuit so as to charge the charging sub-module, with no need for an additional auxiliary power supply. In this solution, control of an input switch is achieved with a simple circuit structure.

As stated above, in addition to the various sub-circuits described above, the switching circuit may also comprise the output switching sub-circuit 440. As shown in FIG. 4, similar to the input switching sub-circuit 420, the output switching sub-circuit 440 may be realized as comprising a functional component (i.e. an NMOS transistor Q3) and other components (a resistor R4, a capacitor C4 and a Zener diode D4). A control end of the output switching sub-circuit 440 is connected to an output end of the charging sub-circuit 410, so as to be subjected to switching control by the charging sub-circuit 410.

Additionally, the switching circuit may also alternatively comprise an MCU output control sub-circuit 450, which may comprise transistors Q4 and Q6 and resistors R7 and R6. The MCU output control sub-circuit 450 may be configured to introduce MCU control at an output side, such that it can be subjected to additional control through software; for example, another additional logic condition is introduced by means of an MCU, such that the output switch Q3 can be turned on only when the additional logic condition is true and the voltage on the capacitor C2 is sufficient to cause it to turn on, and otherwise is turned off.

It should be noted that the devices comprised in the switching circuit above are merely exemplary, and the switching circuit may comprise a greater or smaller number of devices, on condition that the functionality thereof is not affected. For example, the switching circuit may additionally comprise other devices or sub-circuits, or may omit certain devices or sub-circuits shown in the drawings, without departing from the scope of protection claimed in the present disclosure.

Figure 5A:
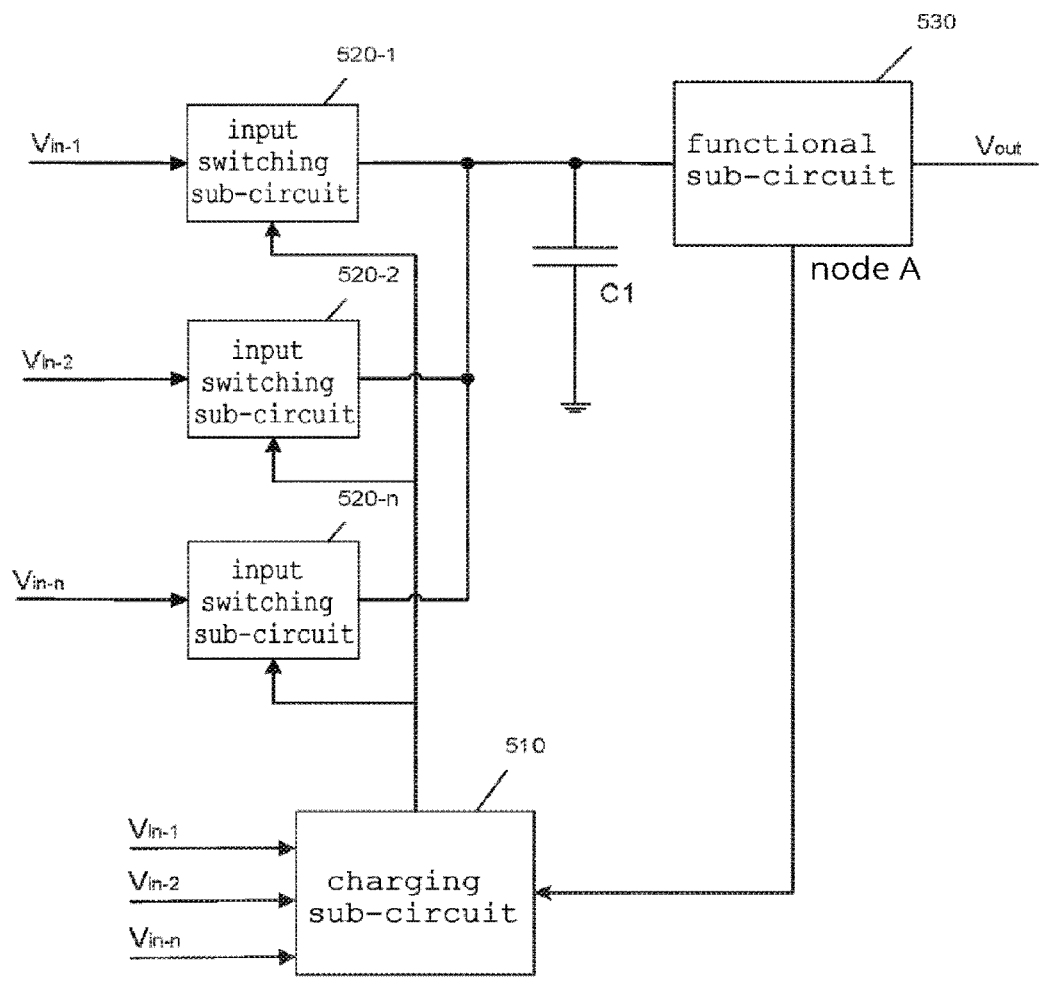
FIGS. 5a) and 5b) show a block diagram and a basic circuit diagram of a circuit when the switching circuit according to an exemplary embodiment of the present disclosure is applied to a multi-input switch.

In addition, according to another aspect of the present disclosure, a multi-input switching circuit is also provided. FIGS. 5a) and 5b) show a block diagram and a basic circuit diagram of a circuit 500 when the switching circuit according to an exemplary embodiment of the present disclosure is applied to a multi-input switch.

As shown in FIG. 5a), the switching circuit 500 for multiple inputs may comprise: multiple input switching sub-circuits 520 (e.g. input switching sub-circuits 520-1, 520-2, . . . , 520-n), a charging sub-circuit 510 and a functional sub-circuit 530. The multiple input switching sub-circuits 520 may correspond to the multiple inputs $V_{in}$, (e.g. inputs $V_{in-1}$, $V_{in-2}$, . . . , $V_{in-n}$) respectively, with each of the multiple input switching sub-circuits 520 having an input end connected to a corresponding input power supply and an output end connected to the functional sub-circuit 530, so as to subject the functional sub-circuit 530 to input reverse protection. A first input end of the charging sub-circuit 510 is connected to a first node of the functional sub-circuit 530, corresponding ports in second input ends are connected to each of the multiple inputs respectively, and an output end of the charging sub-circuit is connected to a control end of each of the multiple input switching sub-circuits 520. In addition, the multi-input switching circuit 500 may also alternatively comprise a first capacitor C1. One end of the first capacitor C1 is connected to the output end for each of the input switching sub-circuits 520, and the other end is grounded. The first node is a node in the functional sub-circuit 530 that has an operating voltage higher than the input voltage of any input power supply.

Figure 5B:
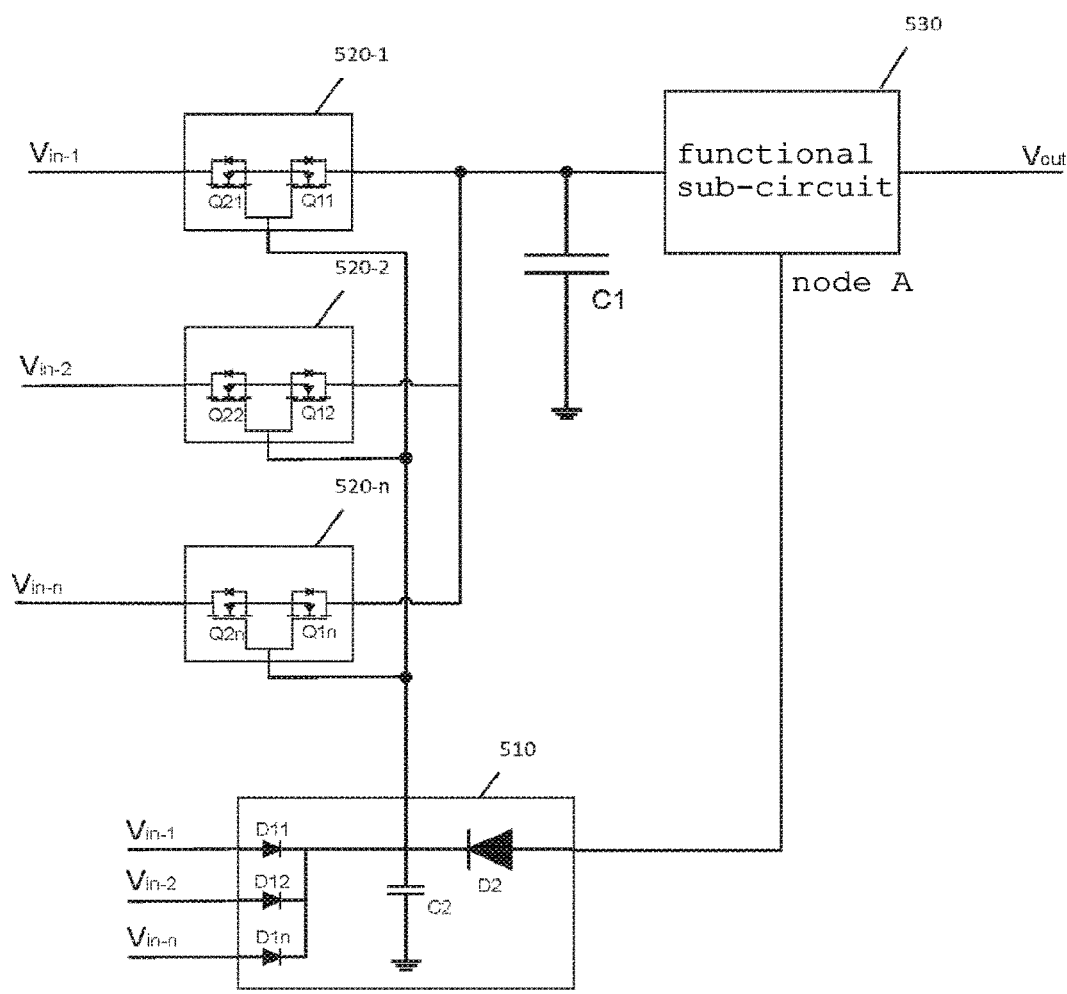

The specific structure of the multi-input switching circuit 500 according to an exemplary embodiment of the present disclosure is now described in detail with reference to FIG. 5b). As shown in FIG. 5b), each of the multiple input switching sub-circuits 520 comprises a pair of N-channel MOSFETs connected in a mirror-image fashion (i.e. connected back-to-back), e.g. NMOS transistor pairs Q11 and Q21, Q12 and Q22, . . . , Q1n and Q2n), and the control end thereof is connected to the output end of the charging sub-circuit 510. Each MOS transistor also has an intrinsic body diode between the drain and source thereof. In each pair of MOS transistors, the body diode of a first MOS transistor (denoted Q1i, where i=1, 2, . . . , n) provides a forward current path before the MOS channel thereof is turned on, and the body diode of a second MOS transistor (denoted Q2i, where i=1, 2, . . . , n) prevents a forward current from reaching the subsequent circuit directly via the body diode of the first MOS transistor and not via the N-channel of the second MOS transistor.

The charging sub-circuit 510 may comprise a first set of diodes (i.e. diodes D11, D12, . . . , D1n), a second diode D2 and a second capacitor C2. The anode of the second diode D2 is connected, as the first input end of the charging sub-circuit 510, to the first node in the functional sub-circuit 530, and the cathode thereof is connected to the control ends of the input switching sub-circuits 520. The anode of each of the first set of diodes D11, D12, . . . , D1n is connected, as a second input end of the charging sub-circuit, to the corresponding input power supply, and the cathode is connected to the control ends of the input switching sub-circuits 520. One end of the second capacitor C2 is connected to the control ends of the input switching sub-circuits 520, and the other end is grounded.

In one example, when a switch having multiple inputs is configured in accordance with the framework structure shown in FIG. 5b), the multi-input switch may also alternatively comprise an MCU input control sub-circuit, which is configured to introduce control from an MCU, such that one particular input power supply or multiple input power supplies can be selected to be turned on according to additional logic control from the MCU. For example, when a first input power supply $V_{in-1}$ is required, only the channels of the MOS transistor pair Q11 and Q21 are turned on while the channels of the MOS transistor pair Q12 and Q22 to the MOS transistor pair Q1n and Q2n are turned off through the joint control of the MCU and the charging sub-circuit, in order to ensure that the first input power supply $V_{in-1}$ is selected to be turned on. Thus, with regard to the input power supplies other than the first input power supply $V_{in-1}$, since the channels of the MOS transistor pairs are all turned off and the MOS transistor pairs (more specifically, the body diodes of the MOS transistor pairs) are connected back-to-back, the corresponding input power supplies cannot be transmitted to the SEPIC converter via the MOS transistor channels and cannot be transmitted to the SEPIC converter via the body diodes of the MOS transistors. Those skilled in the art will understand that although the present disclosure shows the case where one input power supply is selected to be turned on by means of the MCU input control sub-circuit, the present disclosure is not limited to this; the present disclosure can simultaneously select multiple input power supplies or all of the input power supplies to be turned on, or not select any input power supply to be turned on.

Figure 6:
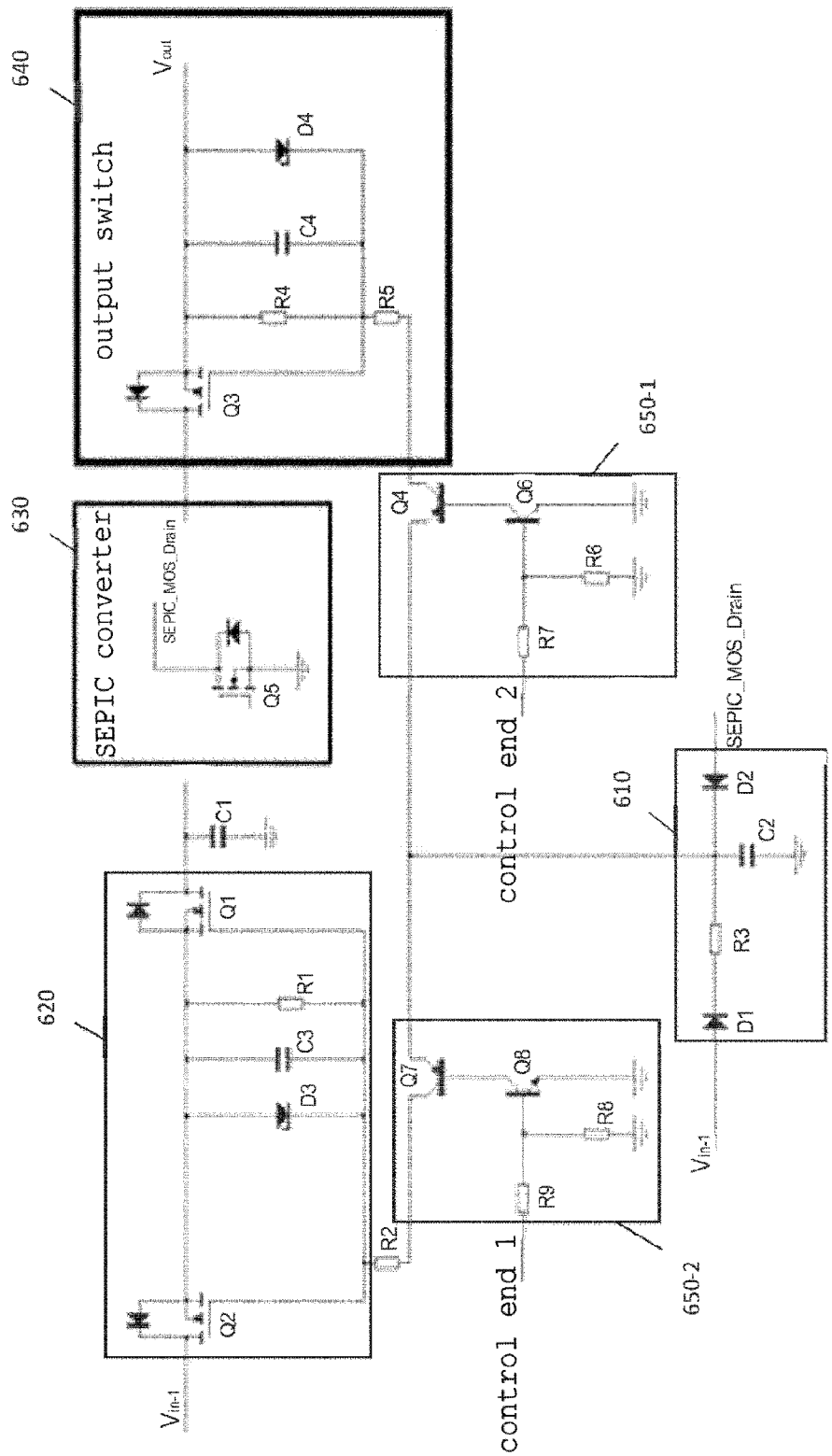
FIG. 6 shows a particular manner of implementation of a circuit when the switching circuit according to an exemplary embodiment of the present disclosure is applied to one of the paths of a multi-input switch.

When one particular input power supply (e.g. the first input power supply $V_{in-1}$) is selected to be turned on by means of the MCU input control sub-circuit, the switching circuit structural diagram of FIG. 6 is obtained. FIG. 6 shows a particular manner of implementation of the circuit when the switching circuit according to an exemplary embodiment of the present disclosure is applied to one of the paths in a multi-input switch and the first input power supply $V_{in-1}$ is selected to be turned on. Similarly to FIG. 4, FIG. 6 shows a manner of implementation of the multi-input switching circuit according to an exemplary embodiment of the present disclosure, taking a SEPIC circuit as an example of a functional sub-circuit 630. As shown in the figure, the switching circuit in FIG. 6 may comprise an input switching sub-circuit 620, a charging sub-circuit 610, a functional sub-circuit 630, an output switching sub-circuit 640 and a first capacitor C1. In addition, the switching circuit in FIG. 6 also additionally comprises an MCU output control sub-circuit 650-1 and an MCU input control sub-circuit 650-2. The MCU output control sub-circuit 650-1 and MCU input control sub-circuit 650-2 can introduce MCU control at an output side and an input side respectively, such that additional control can be performed by means of software.

The charging sub-circuit 610 in FIG. 6 is similar to the charging sub-circuit 410 shown in FIG. 4, wherein the charging sub-circuit 410 may comprise a first diode D1, a second diode D2 and a second capacitor C2. However, unlike FIG. 4, the input switching sub-circuit 620 in FIG. 6 may comprise a pair of MOS transistors Q1 and Q2 connected in a mirror-image fashion, for selecting multiple inputs to be turned on as described above. In addition, the functions of a Zener diode D3, a capacitor C3 and a resistor R1 comprised in the input switching sub-circuit 620 are the same as in FIG. 4; specifically, they are used for preventing excessively large voltages at the bases of the transistors Q1 and Q1 and for resistance matching and current protection.

When the first input power supply $V_{in-1}$ is selected to be turned on through the control of the MCU input control sub-circuit 650-2 but the input switching sub-circuit 620 is not turned on, the first input power supply $V_{in-1}$ charges the second capacitor C2 via the first diode D1, such that the input switching sub-circuit 620 is partially turned on under the action of the voltage of the capacitor C1, so as to charge the first capacitor C1 via the body diodes of the transistors Q2 and Q1 which are partially turned on. When the first capacitor C1 is sufficient to turn on the SEPIC converter 630, the first capacitor C1 supplies power to the SEPIC rapidly, such that the voltage of a first node in the SEPIC converter 630, i.e. the drain voltage of the SEPIC converter (SEPIC_MOS_Drain) rapidly reaches $V_{in-1}+V_{out}$, thereby causing the charging sub-module 610, as an auxiliary power supply, to turn on the input switching sub-circuit 620 completely.

In addition to the various sub-circuits described above, the switching circuit 600 may also alternatively comprise the output switching sub-circuit 640. Similarly to the output switching sub-circuit 440 in FIG. 4, a control end of the output switching sub-circuit 640 is connected to an output end of the charging sub-circuit 610, so as to be subjected to switching control by the charging sub-circuit 610.

Thus, a multi-input switching circuit is realized, which can connect multiple power supplies to a single power supply converter; moreover, control of the NMOS switch is achieved by adding the charging sub-circuit and leading out a node having a high electric potential (higher than the input voltage) in the functional sub-circuit so as to charge the charging sub-module, with no need for an additional auxiliary power supply. In this solution, a multi-input switching circuit is realized with a simple circuit structure.

As can be seen, according to exemplary embodiments of the present disclosure, a switching circuit is realized by hardware, the switching circuit being capable of driving an NMOS switch in a simple configuration, and capable of being applied to an input switching circuit, an output switching circuit or a multi-input switching circuit.

It should be noted that although modes of implementation of the method according to exemplary embodiments of the present disclosure have been described separately above, features described in the various modes of implementation described above could be combined in any way in a single mode of implementation without departing from the concept of the present disclosure, and features described in a single mode of implementation could also be realized separately in multiple modes of implementation.

Although the present disclosure has been shown and described with reference to specific exemplary embodiments of the present disclosure, those skilled in the art should understand that various changes in form and detail could be made to the present disclosure without departing from the spirit and scope of the present disclosure that are defined by the attached claims and their equivalents. Thus, the scope of the present disclosure should not be limited to the embodiments above, but should be determined by the attached claims and defined by the equivalents of the attached claims.

The invention claimed is:

1. A switching circuit, comprising:
 a charging sub-circuit, having a first input end and an output end;
 a switching sub-circuit, having a first end, a second end and a control end, wherein the control end of the switching sub-circuit is connected to the output end of the charging sub-circuit;
 a functional sub-circuit, connected to one of the first end and second end of the switching sub-circuit, and the functional sub-circuit having a first node, wherein an operating voltage of the first node is higher than an input voltage of an input power supply; and
 a first capacitor, one end of the first capacitor being connected to the one of the first end and second end of the switching sub-circuit which is connected to the functional sub-circuit, and another end of the first capacitor being grounded,
 wherein the switching sub-circuit comprises one or more NMOS switches,
 the other of the first end and second end of the switching sub-circuit is connected to the input power supply,
 the charging sub-circuit further comprises a second input end connected to the input power supply, and
 the first input end of the charging sub-circuit is connected to the first node.

2. The switching circuit as claimed in claim 1, wherein when multiple input power supplies are present,
 the switching circuit comprises multiple switching sub-circuits corresponding to the multiple input power supplies, respectively, wherein for each of the multiple switching sub-circuits, one of the first end and second end of the switching sub-circuit is connected to the functional sub-circuit, the other of the first end and second end is connected to the corresponding input power supply, and
 the control end is connected to the output end of the charging sub-circuit; and the charging sub-circuit further comprises multiple second input ends connected to the multiple input power supplies.

3. The switching circuit as claimed in claim 2, wherein each of the multiple switching sub-circuits comprises a pair of N-channel MOSFETs connected in a mirror-image fashion, and the control end thereof is connected to the output end of the charging sub-circuit.

4. The switching circuit as claimed in claim 2, wherein the charging sub-circuit comprises a first set of diodes, a second diode and a second capacitor, wherein:
 the anode of each of the first set of diodes acts as one of the multiple second input ends connected to the multiple input power supplies, and the cathode is connected to the control ends of the switching sub-circuits;
 one end of the second capacitor is connected to the control ends of the switching sub-circuits, and the other end is grounded; and
 the anode of the second diode is connected, as the first input end of the charging sub-circuit, to the first node, and the cathode thereof is connected to the control ends of the switching sub-circuits.

5. A switching circuit, comprising:
a charging sub-circuit, having a first input end, a second input end, an output end, a first diode, a second diode and a first capacitor;
a switching sub-circuit, having a first end, a second end and a control end, wherein the control end of the switching sub-circuit is connected to the output end of the charging sub-circuit; and
a functional sub-circuit, connected to one of the first end and second end of the switching sub-circuit, and the functional sub-circuit having a first node, wherein an operating voltage of the first node is higher than an input voltage of an input power supply,
wherein the switching sub-circuit comprises one or more NMOS switches,
the second input end of the charging sub-circuit is connected to the input power supply,
the anode of the first diode is connected, as the second input end of the charging sub-circuit, to the input power supply, and the cathode is connected to the control end of the switching sub-circuit;
one end of the first capacitor is connected to the control end of the switching sub-circuit, and the other end is grounded;
the other of the first end and second end of the switching sub-circuit is connected to the input power supply; and
the anode of the second diode is connected, as the first input end of the charging sub-circuit, to the first node, and the cathode thereof is connected to the control end of the switching sub-circuit.

6. The switching circuit as claimed in claim 5, wherein when multiple input power supplies are present,
the switching circuit comprises multiple switching sub-circuits corresponding to the multiple input power supplies respectively, wherein for each of the multiple switching sub-circuits, one of the first end and second end of the switching sub-circuit is connected to the functional sub-circuit, the other of the first end and second end is connected to the corresponding input power supply, and
the control end is connected to the output end of the charging sub-circuit; and the charging sub-circuit further comprises multiple second input ends connected to the multiple input power supplies.

7. The switching circuit as claimed in claim 6, wherein each of the multiple switching sub-circuits comprises a pair of N-channel MOSFETs connected in a mirror-image fashion, and the control end thereof is connected to the output end of the charging sub-circuit.

8. The switching circuit as claimed in claim 6, wherein the charging sub-circuit comprises a first set of diodes, a second diode and a second capacitor, wherein:
the anode of each of the first set of diodes acts as one of the multiple second input ends connected to the multiple input power supplies, and the cathode is connected to the control ends of the switching sub-circuits;
one end of the second capacitor is connected to the control ends of the switching sub-circuits, and the other end is grounded; and
the anode of the second diode is connected, as the first input end of the charging sub-circuit, to the first node, and the cathode thereof is connected to the control ends of the switching sub-circuits.

9. A switching circuit, comprising:
a charging sub-circuit, having a first input end and an output end;
a switching sub-circuit, having a first end, a second end and a control end, wherein the control end of the switching sub-circuit is connected to the output end of the charging sub-circuit; and
a functional sub-circuit, connected to one of the first end and second end of the switching sub-circuit, and the functional sub-circuit having a first node, wherein an operating voltage of the first node is higher than an input voltage of an input power supply,
wherein the switching sub-circuit comprises one or more NMOS switches,
the first input end of the charging sub-circuit is connected to the first node, and
when an output end of the functional sub-circuit is connected to one of the first end and second end of the switching sub-circuit, another end of the switching sub-circuit is configured to output an output signal of the functional sub-circuit.

* * * * *